United States Patent
Rouviere

(10) Patent No.: US 11,152,783 B2
(45) Date of Patent: Oct. 19, 2021

(54) CIRCUIT OF PROTECTION AGAINST ELECTROSTATIC DISCHARGES

(71) Applicant: STMicroelectronics (Tours) SAS, Tours (FR)

(72) Inventor: Mathieu Rouviere, Tours (FR)

(73) Assignee: STMicroelectronics (Tours) SAS, Tours (FR)

( * ) Notice: Subject to any disclaimer, the term of this patent is extended or adjusted under 35 U.S.C. 154(b) by 151 days.

(21) Appl. No.: 16/358,964

(22) Filed: Mar. 20, 2019

(65) Prior Publication Data
US 2019/0296545 A1    Sep. 26, 2019

(30) Foreign Application Priority Data

Mar. 22, 2018 (FR) .................................... 1852482

(51) Int. Cl.
*H02H 9/04* (2006.01)
*H01L 27/02* (2006.01)
*H01L 27/06* (2006.01)

(52) U.S. Cl.
CPC ........... *H02H 9/04* (2013.01); *H01L 27/0255* (2013.01); *H01L 27/0262* (2013.01); *H02H 9/046* (2013.01); *H01L 27/02* (2013.01); *H01L 27/0248* (2013.01); *H01L 27/0629* (2013.01)

(58) Field of Classification Search
CPC ... H02H 9/04; H01L 27/0255; H01L 27/0262; H01L 27/02; H01L 27/0248; H01L 27/0629
USPC ......................................... 361/56, 91.1, 111
See application file for complete search history.

(56) References Cited

U.S. PATENT DOCUMENTS

| 5,500,546 | A | | 3/1996 | Marum et al. |
| 5,600,525 | A | * | 2/1997 | Avery .................... H02H 9/041 361/56 |
| 5,610,425 | A | | 3/1997 | Quigley et al. |
| 5,821,572 | A | | 10/1998 | Walker et al. |
| 6,172,383 | B1 | * | 1/2001 | Williams ................ H02M 1/32 257/173 |
| 7,298,599 | B1 | * | 11/2007 | Vashchenko ........ H01L 27/0266 361/56 |
| 7,589,944 | B2 | | 9/2009 | Mergens et al. |
| 8,218,276 | B2 | | 7/2012 | Mallikarjunaswamy |
| 9,337,178 | B2 | | 5/2016 | Marreiro et al. |
| 2006/0091464 | A1 | * | 5/2006 | Hiraoka .............. H01L 27/0262 257/355 |

(Continued)

FOREIGN PATENT DOCUMENTS

| EP | 0742591 A1 | 11/1996 |
| EP | 1505733 A2 | 2/2005 |
| FR | 2960105 A1 | 11/2011 |

OTHER PUBLICATIONS

INPI Search Report and Written Opinion for FR 1852482 dated Nov. 9, 2018 (8 pages).

*Primary Examiner* — Danny Nguyen
(74) *Attorney, Agent, or Firm* — Crowe & Dunlevy

(57) ABSTRACT

A circuit for protecting against electrostatic discharges includes two avalanche circuit components having different turn-on delays with respect to a beginning of an electrostatic discharge. The two avalanche circuit components are coupled in parallel. The avalanche circuit component closer to an output node has a turn-on delay on the order of 30 ns, while the avalanche circuit component closer to an input node has a turn-on delay on the order of 1 ns.

15 Claims, 2 Drawing Sheets

(56) References Cited

U.S. PATENT DOCUMENTS

| | | | |
|---|---|---|---|
| 2009/0268361 A1* | 10/2009 | Mallikarjunaswamy | ............ H01L 29/7436 361/56 |
| 2009/0273868 A1 | 11/2009 | Liu et al. | |
| 2014/0029145 A1* | 1/2014 | Mayerhofer | ........ H01L 27/0255 361/56 |
| 2014/0159108 A1* | 6/2014 | Marreiro | ............. H01L 27/0248 257/140 |
| 2016/0013638 A1* | 1/2016 | Glas | .................... H01L 27/0248 361/56 |
| 2017/0077082 A1* | 3/2017 | Marreiro | ............. H01L 27/0262 |
| 2018/0287376 A1* | 10/2018 | de Raad | ............. H01L 27/0285 |

\* cited by examiner

CIRCUIT OF PROTECTION AGAINST ELECTROSTATIC DISCHARGES

PRIORITY CLAIM

This application claims the priority benefit of French Application for Patent No. 1852482, filed on Mar. 22, 2018, the content of which is hereby incorporated by reference in its entirety to the maximum extent allowable by law.

TECHNICAL FIELD

The present disclosure concerns a circuit for protection against electrostatic discharges, and more particularly protection circuits with one resistor and two identical avalanche circuit components as commonly referred to as "Z-R-Z-type" structures.

BACKGROUND

Issues relating to electrostatic discharges are all the more present now as electronic circuit components become smaller and smaller and closer and closer to one another. The protection of electronic circuits against electrostatic discharges is important issue to help ensure the reliability and the durability of the circuits.

There thus is a permanent need for electrostatic discharge protection circuits having better performance.

SUMMARY

In an embodiment, a circuit for protection against electrostatic discharges includes, in parallel, two avalanche circuit components having different turn-on delays with respect to the beginning of an electrostatic discharge.

According to an embodiment, the two components are coupled to a node of application of a reference potential.

According to an embodiment, the reference potential is the ground.

According to an embodiment, the circuit further comprises a resistor.

According to an embodiment, the resistor has a resistivity on the order of a few ohms.

According to an embodiment, a first one of the two components couples a first node to the node of application of the reference potential and a second one of the two components couples a second node to the node of application of a reference potential.

According to an embodiment, the first node is an input node and the second node is an output node.

According to an embodiment, the first one of the two components may be at least one thyristor.

According to an embodiment, the thyristor has its anode coupled to the first node and its cathode coupled to the node of application of the reference potential.

According to an embodiment, the second one of the two components may be at least one avalanche diode.

According to an embodiment, the avalanche diode has its anode coupled to the node of application of the reference potential and its cathode coupled to the second node.

According to an embodiment, the resistor couples the first node to the second node.

According to an embodiment, the two avalanche circuit components have turn-on delays which differ by some ten nanoseconds.

BRIEF DESCRIPTION OF THE DRAWINGS

The foregoing and other features and advantages will be discussed in detail in the following non-limiting description of specific embodiments in connection with the accompanying drawings, wherein.

DETAILED DESCRIPTION

Figure 1:
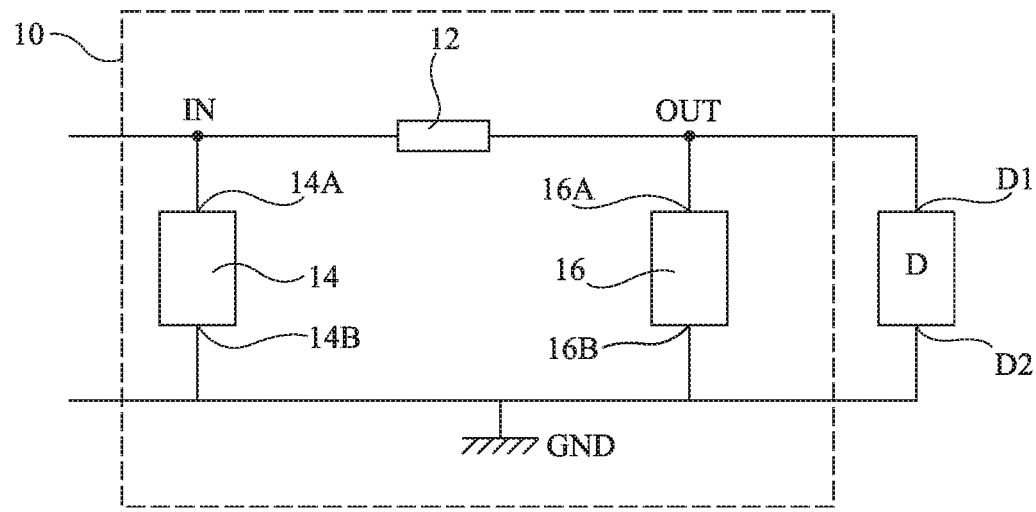
FIG. 1 is a simplified electric diagram of an embodiment of a circuit for protection against electrostatic discharges.

The same elements have been designated with the same reference numerals in the different drawings. For clarity, only those steps and elements which are useful to the understanding of the described embodiments have been shown and are detailed. In particular, the nature of the electronic device to be protected will not be detailed, the protection circuit disclosed in the following description adapting to most electronic circuits.

The terms "approximately", "substantially", and "on the order of" are used herein to designate a tolerance of plus or minus 10%, preferably of plus or minus 5%, of the value in question.

In the present description, the term "connected" will be used to designate a direct electric connection, with no intermediate electronic component, for example, by means of a conductive track, and term "coupled" or term "linked" will be used to designate either a direct electric connection (then meaning "connected") or a connection via one or more intermediate components (resistor, capacitor, etc.).

FIG. 1 is a simplified electronic diagram of an embodiment of a circuit for protection against electrostatic discharges 10, designated with a frame in dotted lines, coupled to an electronic device D to be protected.

Circuit 10 comprises a structure of Z-R-Z type. A Z-R-Z-type structure is an electronic structure used in circuits of protection against electrostatic discharges which comprises three components: one resistor and two identical avalanche circuit components. The resistor is coupled between an input node and an output node of the structure and each avalanche circuit component couples the input node or the output node to a node of application of a reference potential, generally the ground.

According to the described embodiments, circuit 10 is asymmetrical. In other words, circuit 10 comprises a resistor 12 and two avalanche circuit components 14, 16 different from each other.

Resistor 12 couples, preferably connects, an input node IN of circuit 10 to an output node OUT of circuit 10. Avalanche circuit component 14 couples, preferably connects, input node IN of circuit 10 to a node GND of application of a reference potential, for example, the ground. Avalanche circuit component 16 couples, preferably connects, output node OUT of circuit 10 to node GND. Each avalanche circuit component 14, 16 comprises an input terminal 14A, 16A and an output terminal 14B, 16B. Input terminal 14A of avalanche circuit component 14 is coupled, preferably connected, to input node IN and output terminal 14B of component 14 is coupled, preferably connected, to node GND. Input terminal 16A of avalanche circuit component 16 is coupled, preferably connected, to output node OUT and output terminal 16B of component 16 is coupled, preferably connected, to node GND.

Device D to be protected comprises a power supply terminal D1 coupled, preferably connected, to output node OUT of circuit 10, and a reference terminal D2 coupled, preferably connected, to node GND.

Resistor 12 has a resistivity on the order of a few ohms, for example, 1.5Ω.

Component 14 is an avalanche circuit component capable of supplying a clipped voltage of low value (a few volts, for example) with delays on the order of 30 ns with respect to the beginning of the electrostatic discharge. Component 14 comprises one or more thyristors, but component 14 may also comprise one or more diodes, one or more avalanche diodes, and also other components such as resistors, capacitors, etc.

Component 16 is an avalanche circuit component which can be turned on faster than component 14. Component 16 thus enables to clip the overvoltages that component 14 would have missed, particularly at the beginning of the electrostatic discharge. Component 16 for example comprises an avalanche diode, or Zener diode, having a relatively low breakdown voltage, for example in the range from 3 to 5 V.

Components 14 and 16 have close turn-on thresholds (differing by less than a few volts), for example, substantially identical, or preferably identical. Components 14 and 16 for example have a turn-on delay difference on the order of a few tens of nanoseconds.

Circuit 10 operates as follows. When an electrostatic discharge reaches input terminal IN of circuit 10, component 16 turns on first and dissipates the first voltage peak formed by the electrostatic discharge, after which component 14 turns on and dissipates the rest of the energy of the discharge.

Figure 2:
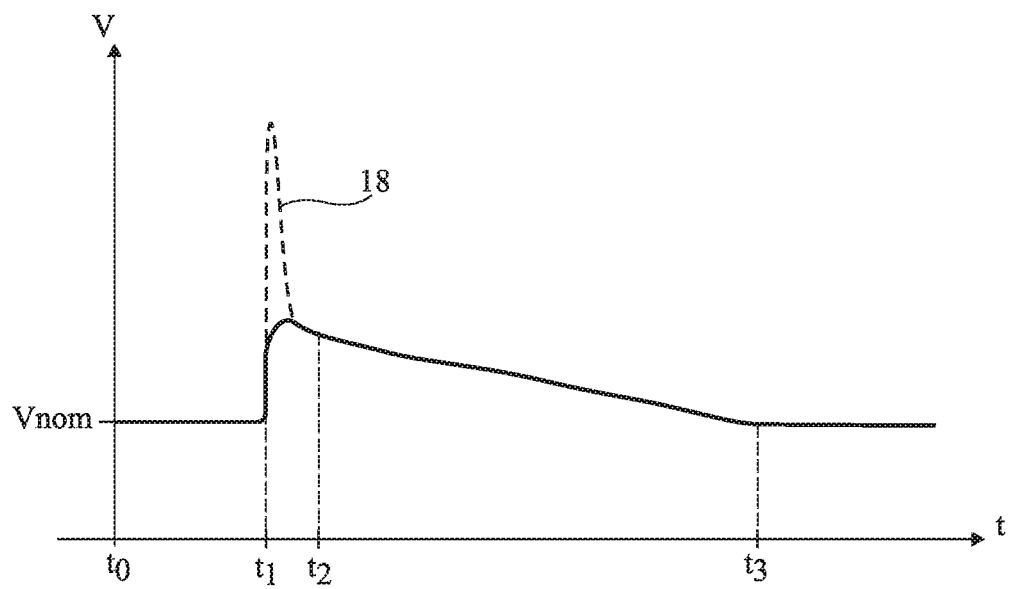
FIG. 2 illustrates the time variation of the voltage across a device to be protected.

FIG. 2 is a graph illustrating the time variation of the voltage across device D protected by the circuit of protection against electrostatic discharges 10 of FIG. 1 when touched by an electrostatic discharge.

Between a time t0 and a time t1, device D is powered with a minimum voltage Vnom via protection circuit 10. Voltage Vnom is applied between nodes IN and GND of circuit 10.

At a time t1, an electrostatic discharge touches circuit 10. Component 16 turns on and dissipates a portion of the discharge. Component 16 then avoids or dissipates a first high voltage peak.

At a time t2, which is for example equal to t1+30 ns, component 14 turns on and dissipates the rest of the discharge and holds a clipped voltage.

At a time t3, protection circuit 10 has dissipated the energy of the electrostatic discharge and the voltage across the device is equal to nominal voltage Vnom again.

An advantage of this embodiment is that component 16 enables dissipation of a first voltage peak formed by the electrostatic discharge. Further, component 14 enables provision of a clipping of the voltage at 30 ns.

FIG. 2 illustrates in dotted lines what would occur with two avalanche circuit components which are identical or have identical turn-on thresholds. This shows that a voltage peak 18 may reach and deteriorate device D before the turning on of the avalanche circuit components.

Figure 3:
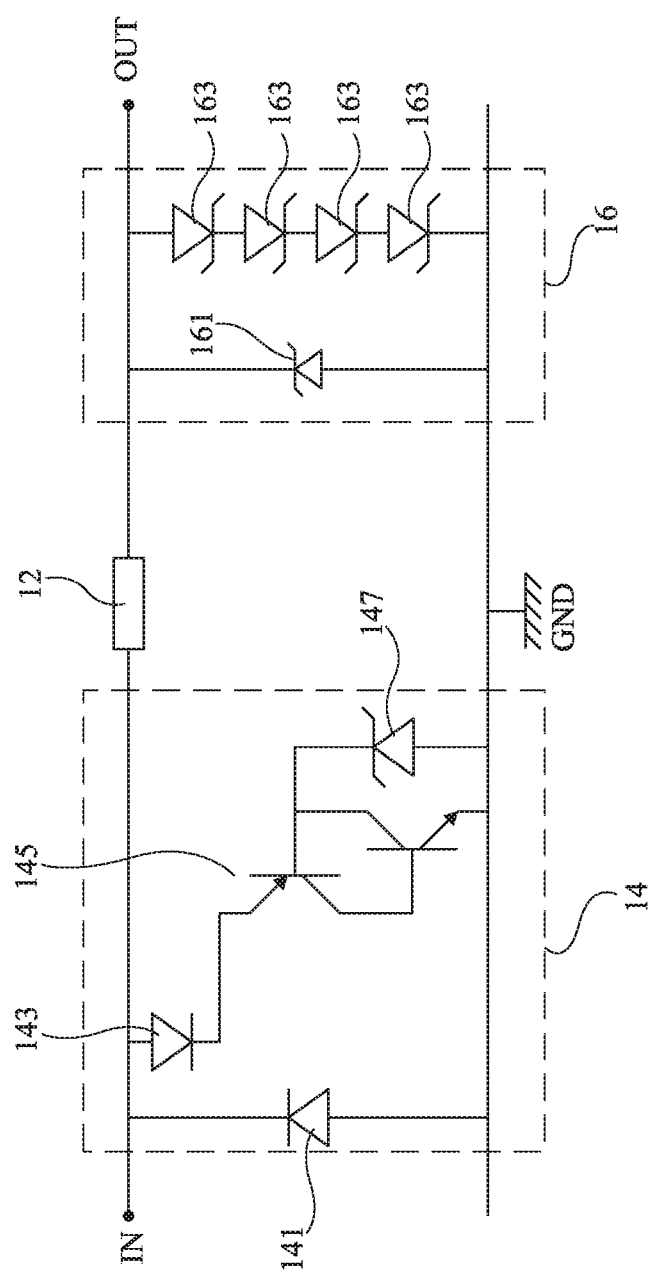
FIG. 3 is an electric diagram of an embodiment of the circuit of FIG. 1.

FIG. 3 is an electric diagram of an embodiment of the circuit of protection against electrostatic discharges 10 of FIG. 1.

In this embodiment, component 14 comprises a diode 141 coupling, preferably connecting, node IN and node GND. More particularly, the cathode of diode 141 is coupled, preferably connected, to node IN and its anode is coupled, preferably connected, to node GND. Component 14 further comprises a diode 143 and an anode gate thyristor 145 (shown in FIG. 4 by the diagram of two transistors connected to each other) in series between nodes IN and GND. The anode of diode 143 is coupled, preferably connected, to node IN and its cathode is coupled, preferably connected, to the anode of thyristor 145. The cathode of thyristor 145 is coupled, preferably connected, to node GND. The gate of thyristor 145 is coupled, preferably connected, to node GND by an avalanche diode 147. More particularly, the cathode of diode 147 is coupled, preferably connected, to the gate of thyristor 145 and its anode is coupled, preferably connected, to node GND.

The component 14 thus described is a component having a turn-on threshold enabling supplying of a low clipped voltage at 30 ns from the beginning of the electrostatic discharge. Indeed, thyristor 145 allows a clipping at a low voltage, but its turning on is not instantaneous.

In this embodiment, component 16 comprises an avalanche diode 161 in parallel with N avalanche diodes 163 (in FIG. 3, only four avalanche diodes 163 are shown). Avalanche diode 161 couples, preferably connects, node OUT to node GND. More particularly, the cathode of avalanche diode 161 is coupled, preferably connected, to node OUT and its anode is coupled, preferably connected, to node GND. Diodes 163 are coupled, preferably connected, in series between node OUT and node GND. More particularly, each diode 163 has its anode on the side of node OUT and its cathode on the side of node GND. During an electrostatic discharge (positive or negative), all the diodes of component 16 operate in avalanche with a faster turning-on than component 14. Component 16 has a turn-on delay shorter than 1 ns.

The component 16 thus described is a component having a low turn-on threshold, which thus enables dissipation of the first voltage peak formed by the electrostatic discharge. Indeed, avalanche diode 161 instantaneously turns on, which enables it to dissipate the first voltage peak. Each positive overvoltage triggers avalanche diode 161 and each negative overvoltage triggers avalanche diodes 163. A number N of avalanche diodes 163 depends on the nominal voltage Vnom at which device D to be protected operates.

Such alterations, modifications, and improvements are intended to be part of this disclosure, and are intended to be within the spirit and the scope of this disclosure. Accordingly, the foregoing description is by way of example only and is not intended to be limiting.

The invention claimed is:

1. A circuit for protection against electrostatic discharges, comprising:
 a first avalanche circuit component comprising a thyristor having a cathode directly electrically connected to a reference potential node, and having an anode coupled to a first node through a diode;
 a second avalanche circuit component;
 wherein the first and second avalanche circuit components are coupled in parallel;
 wherein the second avalanche circuit component comprises:
  an avalanche diode having a cathode coupled to a second node and an anode coupled to the reference potential node; and
  a plurality of series connected avalanche diodes, with a first of the plurality of series connected avalanche diodes having an anode coupled to the second node, and with a last of plurality of series connected avalanche diodes having a cathode coupled to the reference potential node; and wherein the first and second avalanche circuit components have different turn-on delays with respect to a beginning of an electrostatic discharge.

2. The circuit of claim 1, wherein the reference potential node is at ground.

3. The circuit of claim 1, further comprising a resistor directly electrically connected between the second node and the first node.

4. The circuit of claim 3, wherein the resistor has a resistivity of approximately 1.5 ohms.

5. The circuit of claim 1, wherein the first node is an input node and the second node is an output node.

6. The circuit of claim 1, wherein the first and second avalanche circuit components have different turn-on delays.

7. The circuit of claim 6, wherein the different turn-on delays differ by a time in a range of tens of nanoseconds.

8. An electrostatic discharge (ESD) protection discharge circuit, comprising:
    an input node;
    an output node;
    a first avalanche circuit component comprising a thyristor having a cathode directly electrically connected to a reference node, and having an anode coupled to the input node through a first diode; and
    a second avalanche circuit component coupled between the output node and the reference node;
    wherein the second avalanche circuit component comprises:
        an avalanche diode having a cathode coupled to the output node and an anode coupled to the reference node; and
        a plurality of series connected avalanche diodes, with a first of the plurality of series connected avalanche diodes having an anode coupled to the output node, and with a last of plurality of series connected avalanche diodes having a cathode coupled to the reference node;
    wherein the first avalanche circuit component has a turn-on delay longer than a turn-on delay of the second avalanche circuit component.

9. The ESD protection circuit of claim 8, wherein the turn-on delay of the first avalanche circuit component is approximately 30 ns greater than the turn-on delay of the second avalanche circuit component.

10. The ESD protection circuit of claim 8, wherein the first avalanche circuit component comprises:
    a second diode having a cathode coupled to the input node and an anode coupled to the reference node.

11. The ESD protection circuit of claim 8, further comprising an avalanche diode having a cathode coupled to a gate of the thyristor and an anode coupled to the reference node.

12. The ESD protection circuit of claim 8, wherein the plurality of series connected avalanche diodes comprises first, second, third, and fourth avalanche diodes, and wherein:
    an anode of the first avalanche diode is coupled to the output node;
    an anode of the second avalanche diode is coupled to a cathode of the first avalanche diode;
    an anode of the third avalanche diode is coupled to a cathode of the second avalanche diode;
    an anode of the fourth avalanche diode is coupled to a cathode of the third avalanche diode; and
    a cathode of the fourth avalanche diode is coupled to the reference node.

13. The ESD protection circuit of claim 8, further comprising a resistor coupled between the input node and the output node.

14. The ESD protection circuit of claim 8, wherein the first diode has an anode directly electrically connected to the input node and a cathode directly electrically connected to the anode of said thyristor.

15. The circuit of claim 1, wherein the diode has an anode directly electrically connected to the first node and a cathode directly electrically connected to the anode of said thyristor.

* * * * *